(12) United States Patent
Hirota

(10) Patent No.: US 8,523,117 B2
(45) Date of Patent: Sep. 3, 2013

(54) BOARD FIXING STRUCTURE

(75) Inventor: Hideyuki Hirota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 210 days.

(21) Appl. No.: 13/133,081

(22) PCT Filed: Dec. 16, 2009

(86) PCT No.: PCT/JP2009/006924
§ 371 (c)(1),
(2), (4) Date: Jun. 6, 2011

(87) PCT Pub. No.: WO2010/113234
PCT Pub. Date: Oct. 7, 2010

(65) Prior Publication Data
US 2011/0248132 A1  Oct. 13, 2011

(30) Foreign Application Priority Data

Mar. 31, 2009  (JP) .................................. 2009-086446

(51) Int. Cl.
*G12B 9/00*  (2006.01)
(52) U.S. Cl.
USPC ....................... 248/27.1; 248/917; 361/679.29
(58) Field of Classification Search
USPC .................. 248/27.1, 27.3, 917; 361/679.02, 361/679.29
See application file for complete search history.

(56) References Cited

U.S. PATENT DOCUMENTS

| | | | | |
|---|---|---|---|---|
| 5,366,185 A * | 11/1994 | Michael et al. | ............... | 248/27.1 |
| 5,410,373 A * | 4/1995 | Sagues et al. | ................. | 348/825 |
| 5,769,519 A | 6/1998 | Nicolai | | |
| 5,823,495 A * | 10/1998 | Joss et al. | .................... | 248/309.1 |
| 5,913,581 A | 6/1999 | Stephan et al. | | |
| 6,754,070 B2 * | 6/2004 | Chen | ......................... | 361/679.26 |
| 6,982,868 B2 * | 1/2006 | Schach et al. | ............ | 361/679.21 |
| 7,120,010 B2 * | 10/2006 | Tajima | ...................... | 361/679.21 |
| 7,201,356 B2 * | 4/2007 | Huang | ........................... | 248/309.1 |
| 8,273,999 B2 * | 9/2012 | Hirota | ........................... | 174/563 |
| 2005/0067550 A1 * | 3/2005 | Kim et al. | ...................... | 248/917 |
| 2006/0186310 A1 * | 8/2006 | Ho | ............................... | 248/917 |
| 2010/0230549 A1 * | 9/2010 | Probasco et al. | .............. | 248/27.1 |
| 2010/0238643 A1 * | 9/2010 | Huang | .......................... | 361/829 |

FOREIGN PATENT DOCUMENTS

| | | |
|---|---|---|
| DE | 19507728 C1 | 8/1996 |
| DE | 19834463 C2 | 2/2000 |
| JP | 50-150758 | 12/1975 |
| JP | 59-103492 U | 7/1984 |
| JP | 60-219797 A | 11/1985 |
| JP | 3-39889 U | 4/1991 |
| JP | 6-17286 U | 3/1994 |

\* cited by examiner

*Primary Examiner* — Bradley Duckworth
(74) *Attorney, Agent, or Firm* — Birch, Stewart, Kolasch & Birch, LLP

(57) ABSTRACT

A protrusion 31 formed at an end edge of a board that is not screw-fixed is inserted into a rectangular opening engaging section 25 formed on a chassis 2, sides of the board are mounted on a screw-fixing section (also serving as a board receiver) 21, and a first and a second board receiving sections 22, 26 that are formed on the chassis 2 by a cutting and raising manner, respectively, the board 3 is gripped by board gripping sections 23a, 23b, and one side of the board 3 is screw-fixed to the screw-fixing section (also serving as the board receiver) 21.

6 Claims, 7 Drawing Sheets

BOARD FIXING STRUCTURE

TECHNICAL FIELD

The present invention relates to a board fixing structure for fixing a board to a chassis in an electric apparatus.

BACKGROUND ART

In an electric apparatus mounted on a moving body such as a motor vehicle, when a board having attached thereto a heavyweight structure such as display or indicator is assembled to a sheet-metal chassis, it is necessary for the board to have one size larger outer shape larger than that of the structure because the fixation is implemented with screws. For this reason, since the board has a larger size, it is required that the electronic apparatus itself have an increased size, thus interfering with space savings. Further, the application of a large number of screws for the fixation of the board deteriorates the abilities of the board to be assembled and disassembled. Incidentally, even if it is contemplated that the number of the screws is reduced, since the board has a heavyweight structure attached thereto, it is difficult to support the weight of the structure by a method other than the screw fixation.

Patent Document 1 discloses a grounding structure for an apparatus for high frequency having reduced screw-fixing points, which enables the handling and management thereof, to be intended for cost reduction.

PRIOR ART DOCUMENTS

Patent Documents
    Patent Document 1: JU-A-06-17286 (JU-A-1994-17286)

SUMMARY OF THE INVENTION

In the structure disclosed in Patent Document 1, a pressing section for pressing a board is composed of a trailing tongue that has a contact section for resiliently coming in contact with a side edge of the top face of the board, and is formed by introducing a cutout at a portion of a side of a chassis and inwardly bending the portion thereof. However, this is a problem such that this structure is insufficient for attaching firmly a board having a heavyweight structure fastened thereto to a chassis.

The present invention has been made to solve the above-mentioned problems, and an object of the invention is to provide a structure that facilitates the handling and maintaining thereof by reducing screw-fixing points thereof, implements a positioning thereof with a more favorable assembling ability, and eliminates the need for a space for screw fixation in a board to thus achieve the space savings of the board and electronic apparatus.

A board fixing structure according to the present invention has: a box-shaped and hollows chassis, and a board wherein the chassis includes: a first board receiving section that is formed inwardly from a portion of each side plate of the chassis, a board gripping section that is formed inwardly from another portion of each side plate thereof; a rectangular opening engaging section that is formed and folded at a substantially right angle at an edge of an upper end of a back side plate thereof; and a second board receiving section that is formed from both sides of the rectangular opening engaging section toward the interior of the chassis, and wherein the board includes: a protrusion formed at an edge thereof to engage with the rectangular opening engaging section.

Also, a board fixing structure according to the present invention has: a box-shaped and hollows chassis, and a board having a heavyweight structure attached thereto and having screw-fixing points reduced at the leading edge thereof in the assembling direction thereof, wherein the chassis includes: a first board receiving section that is formed at the same height position as that of a screw-fixing section also serving as a board receiver by cutting and raising inwardly a portion of each side plate of the chassis, the two side plates opposing each other across the screw-fixing section also serving as the board receiver that is provided in the interior of the chassis; a board gripping section that is formed by cutting and raising inwardly another portion of each side plate thereof; a rectangular opening engaging section that is formed and folded at a substantially right angle at an edge of an upper end of a back side plate thereof; and a second board receiving section that is formed by horizontally extending from both sides of the rectangular opening engaging section toward the interior of the chassis, and formed at the substantially same height position as those of the screw-fixing section also serving as the board receiver and the first board receiving section, and wherein the board includes: a protrusion formed at an edge thereof that is not screw-fixed to engage with the rectangular opening engaging section; and a screw passing hole for threadedly engaging with the screw-fixing section also serving as the board receiver.

According to the present invention, it is arranged as follows: the protrusion formed at the edge of the board that is not screw-fixed is inserted into the rectangular opening engaging section formed on the chassis; the sides of the board are mounted on the screw-fixing section also serving as the board receiver, and the first and the second board receiving sections that are formed on the chassis in a cutting and raising manner, respectively; each side portion of the board is gripped by the board gripping sections; and one side of the board is screw-fixed to the screw-fixing section also serving as the board receiver, thereby reducing the number of screw fixations. Also, the necessity of a space for the screw fixation can be eliminated on the front end side and each side of the board to be gripped and held by the rectangular opening engaging section and the board gripping sections, thereby implementing space savings in the board and electronic apparatus.

BEST MODE FOR CARRYING OUT THE INVENTION

Embodiments of the present invention will now be described with reference to the accompanying drawings in order to explain the present invention in more detail.

First Embodiment

Figure 1:
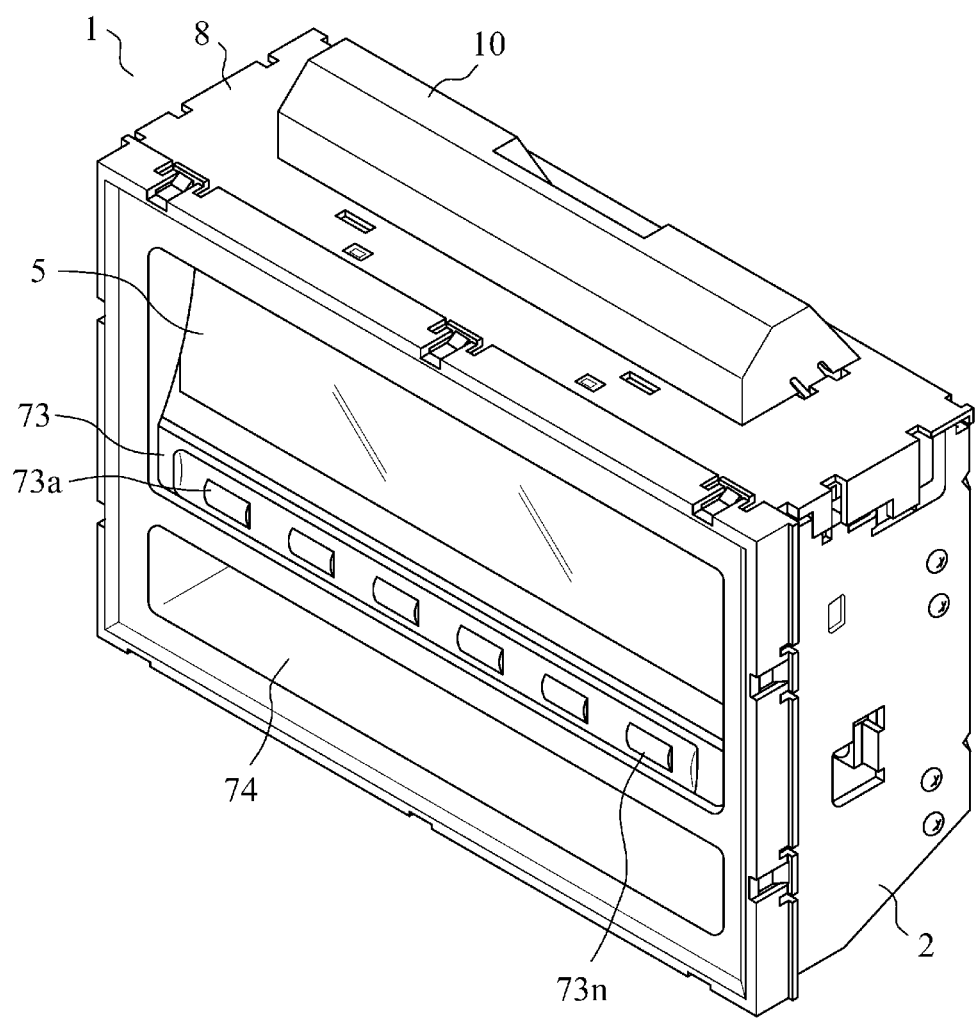
FIG. 1 is a schematic view of an electronic apparatus to which a board fixing structure according to the present invention is applied.

In the following, a board fixing structure according to the present invention will be described with reference to the drawings. First, the outline of an electronic apparatus to which the board fixing structure according to the invention is applied will be discussed based on FIG. 1 and FIG. 2. An electronic apparatus 1 includes: a box-shaped and hollow chassis 2; a board 3 to be assembled to the interior of the chassis 2; a display 4 to be assembled to the board 3 through a holder 9; a panel 7 to be assembled to the chassis 2, while a filter 5 disposed opposite the display 4 is attached thereto together with a hood 6; and a cover 8 for covering the opening of the chassis 2 after assembling all of the above parts. Note that in the following descriptions, expressions of "upper and lower side plates," "front and back side plates," and also "right and left side plates" are based on a state where the electronic apparatus is disposed at an in-service position.

The chassis 2 includes: a screw fixing section (also serving as a board receiver) 21 provided in the interior thereof; a first board receiving section 22 that is formed at the same height position as that of the screw fixing section (also serving as a board receiver) 21 by cutting and raising inwardly a portion of each side plate of the chassis 2; board gripping sections 23a, 23b (one of the sections is not shown) that are formed so as to grip the board 3 by cutting and raising inwardly another portion of each side plate of the chassis 2; a board assembling guide section 24 that is formed by folding a portion of the first board receiving section 22 at a substantially right angle toward the board mounting side; and a rectangular opening engaging section 25 formed by turning at a substantially right angle at the upper edge of the back side plate of the chassis 2 so as to engage with a protrusion 31 formed at the edge of the board that is not fixed by screws, and also a second board receiving section 26 that is formed by horizontally extending from each side of the rectangular opening engaging section toward the interior of the chassis and formed at the substantially same height position as those of the screw fixing section (also serving as a board receiver) 21 and the first board receiving section 22.

Further, the chassis 2 is formed of an L-shaped hooking section 27 formed by bending inwardly a portion of a cover mounting opening end of each side plate thereof; an assembly guide section 28 dimpling inwardly the side of the opening end of the chassis 2 by the thickness of the cover 8 in the vicinity of the hooking section 27; and a tapped hole 101 and an engaging hole 102 formed through the upper part of the back side plate thereof.

The display 4 has a rectangular shape with a certain thickness. A holder 9 for holding the display 4 assembled thereto is made of a resin material, and includes: resilient lugs 91 serving as an urging unit in the direction of thickness, and formed on the bottom face by cutting and raising a portion of the bottom face so as to urge the display 4 mounted thereon in the direction of thickness; resilient lugs 92 working as an urging unit in the downward direction, and formed by cutting and raising inwardly a portion of the upper side plate so as to urge the display 4 toward the terminal side; resilient lugs 93 working as a sandwiching unit, and formed by cutting and raising inwardly a portion of each of the right and the left side plates so as to sandwich the display 4 from right and left; and resiliently engaging claws 94 and 95 serving as a surface pressing unit, and formed on the upper side plate, and also the right and the left side plates so as to press the surface of the display 4.

Also, resiliently engaging claws 96 and 97 for assembling and fixing the holder 9 to the board 3 are formed on the back side plate and the right and left side plates of the holder 9 by extending in the direction of thickness. Further, engaging claws for engaging with holes of the board 3 are formed on the bottom face thereof; however, indications thereof will be omitted in FIG. 2.

The panel 7 includes an assembling wall 70 relative to the chassis 2 therearound, and has a display window 71 that is formed inside a predetermined distance away from the upper side plate forming the wall 70; a filter mounting section 72 formed in the shape of a frame on the fringe of the display window 71; an operation button housing section 73 for housing a plurality of operation buttons 73a to 73n that are formed along the lower edge of the filter mounting section 72; and a glove compartment 74 that is formed and positioned between the operation button housing section 73 and the lower side plate of the wall 70. The upper and the lower side plates and the right and the left side plates forming the assembling wall 70 are provided with rectangular opening engaging sections 70a for engaging with the engaging claws formed on the chassis 2.

The hood 6 is made of a resin material in the shape of a frame, and has cover sections 61 and engaging holes 62 on the upper frame side plate thereof that is assembled to the outer face of the upper side plate of the filter mounting section 72. Further, the hood 6 has on the lower frame side plate thereof resilient press sections 63 that are formed by projecting at a specific interval so as to abut against the bottom face of the operation buttons, and engaging projections (omitted in FIG. 2) for engaging with engaging concavities.

The filter 5 is formed with a curved face so as to conform to the filter mounting section 72. At the upper end edge of the filter, there is provided with hooking resiliently engaging claws 51 having a taper and formed at a specific interval so as to engage with rectangular opening engaging sections (omitted in FIG. 2) of the panel 7; and concavities 54 formed at the positions with which the protrusions (omitted in FIG. 2) formed in the filter mounting section 72 is engaged, while at the lower end edge thereof, there is provided with engaging claws 52 and positioning convexities 53 formed so as to engage with the resiliently engaging claws 75 and the positioning concavities 76 formed on the outer face of the operation button housing section 73, respectively.

In the cover 8, hooking claws 81 for engaging with the L-shaped hooking sections 27 of the chassis 2; and guide lugs 82 for engaging with the assembly guide sections 28 are formed with extending from the upper end edge of each side plate of the cover in the assembling direction, and also the cover has a right-angularly bent lug 83 to be superposed on the outer face of the back side plate of the chassis 2; screw passing holes (omitted in FIG. 2) opposed to the tapped holes 101 of the chassis; and engaging claws 85 for engaging with the engaging holes 102. It is preferable to provide a taper 85a on the engaging claw 85 such that the engaging claw easily engages with the engaging hole 102. Further, four corners of the engaging hole 102 are arranged to have a circular arc portion and the circular arc portion is normally caused to come in contact with the engaging claw 85.

Figure 2:
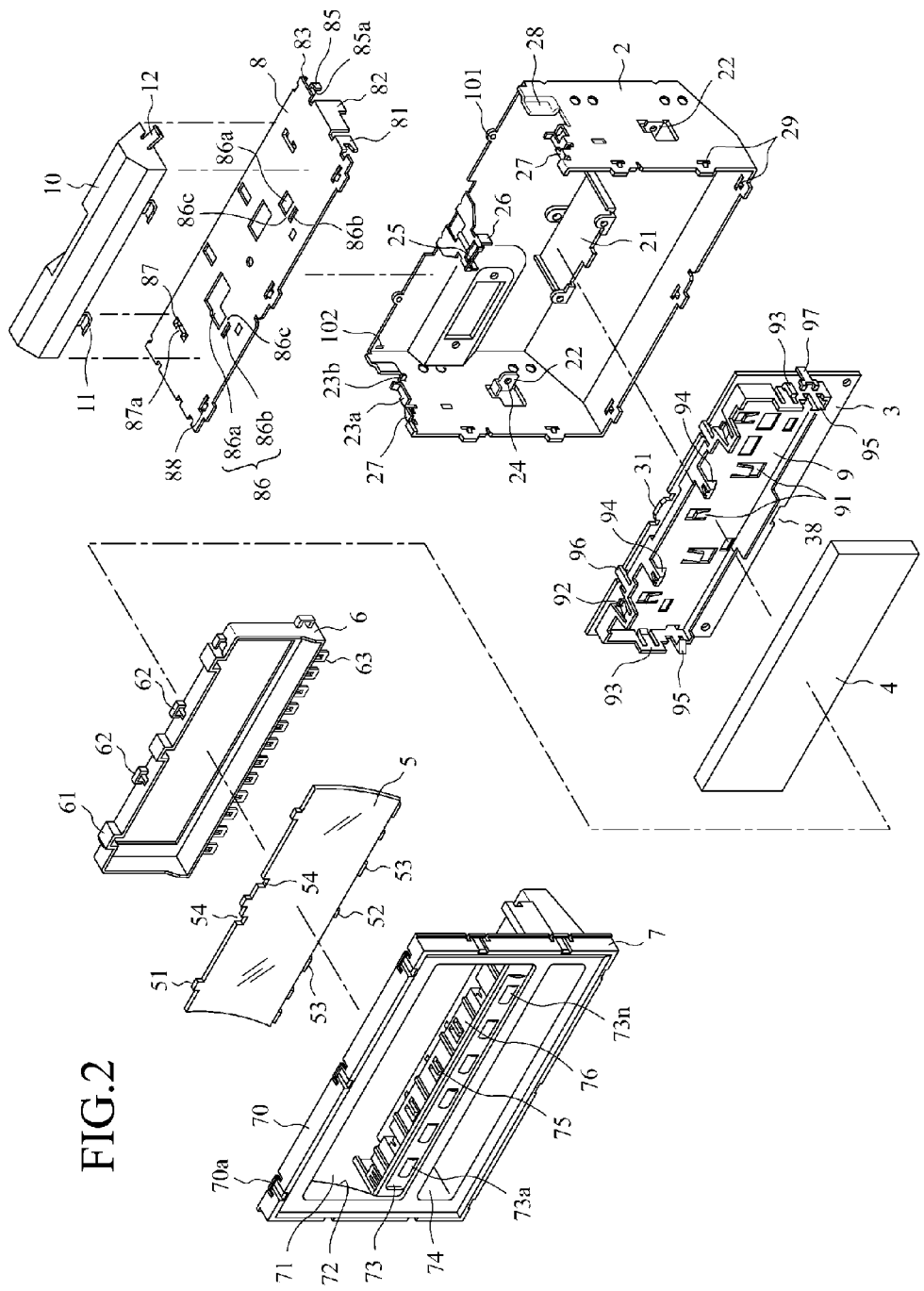
FIG. 2 is an exploded perspective view of the electronic apparatus.

The engagement faces between the hooking section 27 and the hooking claw 81 are provided with tapers (omitted in FIG. 2) such that the chassis 2 and the cover 8 impart a pressing force to each other, and the terminal portions of the tapers are formed in the shape of a circular arc (omitted in FIG. 2). Further, the cover 8 includes engaging hole sections 86 formed by juxtaposing two holes 86*a*, 86*b* and resiliently engaging lugs 87*a* formed by extending downwardly one side of the edges of a cut-raised hole 87.

On the other hand, in a case 10 assembled to the cover 8, substantially U-shaped resiliently engaging claws 11 also serving as a positioner to engage with the engaging hole sections 86 of the cover 8; and resiliently engaging claws 12 extending downward so as to pass through the cut-raised hole 87 of the cover 8 and normally engage with the lower end of the engaging lug 87*a* are formed at the opening end edge of the case 10 to be opposite thereto.

In the following, assembly of the parts will be described. To assemble the display 4 to the holder 9, as the display 4 is pressed to the holder 9 from the top face thereof, the display 4 advances while outwardly pressing and widening the resilient lugs 92, the resilient lugs 93, and the resiliently engaging claws 94 and 95, and further advances while depressing the resilient lugs 91. Further, as the display 4 passes therethrough, the resilient lugs 92 urge the display 4 to a terminal side, the resilient lugs 93 sandwich the display 4 from right and left, and the resiliently engaging claws 94 and 95 press and maintain the face of the display 4 to be forced upwardly by the urging force of the resilient lugs 91, thus completing the assembly of the display 4 to the holder 9. After completing the assembly (the following processes may be performed before the assembly of the display), the holder 9 is assembled to the board 3 with the resiliently engaging claws 96 and 97, and the engaging claws (not depicted), as shown in FIG. 2.

Then, the board 3 having the display 4 assembled thereto is mounted on the first board receiving sections 22 formed on each side plate of the chassis 2 to be moved in the assembling direction and be sandwiched at both side edges thereof by the board gripping sections 23*a*, 23*b*. At the movement terminated position, the board 3 is mounted on the second board receiving section 26 at the moving front end thereof, and the protrusion 31 formed at the end edge of the board that is not fixed by screws enters the rectangular opening engaging section 25. In this state, the board 3 is mounted on the screw fixing section (also serving as a board receiver) 21 at the back end side thereof to be fixed by screws.

On the other hand, to assemble the cover 8 to the opening of the upper face of the chassis 2, the guide lug 82 of the cover 8 is moved along the assembly guide section 28 of the chassis 2 to cause the cover 8 to abut against the opening end of the chassis 2, thus preventing the cover 8 drawn too much to the chassis side to be lowered.

Next, the cover 8 is moved until the right-angularly bent lug 83 abuts against the outer face of the back sideplate of the chassis 2 in a state where the cover is abutted against the opening end face thereof to thereby engage the hooking section 27 with the hooking claw 8, and then adjust these lateral and vertical positions to be in mesh with each other. In this case, since the hooking section 27 and the hooking claw 81 are formed with a taper: an entrance thereof is widened and a root thereof is narrowed, the hooking section and the hooking claw are easily combined to each other, and also they can be firmly secured to each other in the combined state. Further, by providing circular arc portions at the roots of the hooking section 27 and the hooking claw 81, respectively, the hooking section 27 and the hooking claw 81 are caused to normally come in contact with each other, thus enabling the two engaging members to be maintained at tension.

Further, as the right-angularly bent lug 83 of the cover 8 is abutted against the outer face of the back sideplate of the chassis 2 to be superposed, the engaging claw 85 formed at the right-angularly bent lug 83 engages with the engaging hole 102 of the back side plate of the chassis 2, and thereby the cover 8 is positioned and held to the chassis 2. Therefore, while maintaining this state, a screw (omitted in FIG. 2) passed through the screw passing hole of the right-angularly bent lug 83 is screwed into the tapped hole 101 of the chassis 2 to be screw-fixed. In this case, the engaging claw 85 has the taper, and the four corners of the engaging hole 102 are formed with a circular arc portion. Thus, the engaging claw 85 is easily inserted into the engaging hole 102, the engaging claw 85 is normally in contact with the corner of the circular arc portion of the engaging hole 102, and the back plate of the chassis 2 is gripped between the cover 8 and the engaging claw 85, thus enabling the cover and the chassis to be maintained at tension.

On the other hand, to assemble the filter 5 to the panel 7, as the hooking engaging claw 51 of the filter 5 is first engaged with the rectangular opening engaging section (not shown) of the panel 7 to press the side of the lower end of the filter against the one of the panel, the resiliently engaging claw 52 engages with the engaging claw 75 on the side of the panel in this process, and also the positioning convexity 53 engages with a positioning concavity 76 on the side of the panel, thus assembling the filter 5 to the panel 7.

After assembling the filter, the peripheral portion of the hood 6 is fitted in an L-shaped drawing positioning section (omitted in FIG. 2) on the side of the panel such that the peripheral portion of the filter is covered, and engaging claws (omitted in FIG. 2) on the side of the panel are engaged with the engaging holes 62. This assembly causes the cover sections 61 to cover rectangular opening engaging sections (omitted in FIG. 2) located on the side of the panel, and the resilient pressing sections 63 abut against the bottom faces of the operation buttons 73*a* to 73*n* to impart a restoring force to the operation buttons.

The wall 70 of the panel 7, to which the filter 5 and the hood 6 have been thus assembled, is fitted in the front opening of the chassis 2 having the board 3 assembled thereto as discussed above, and cut-raised engaging claws 29 formed on the chassis 2, and cut-raised engaging claws 88 of the cover 8 are engaged with the rectangular opening engaging sections formed on the wall 70, thus completing the assembly of the electronic apparatus 1.

Moreover, before the assembly or after the completion of the assembly as mentioned above, the case 10 is assembled and fixed to the cover 8. In this case, the substantially U-shaped resiliently engaging claws 11 of the case 10 are inserted from the holes 86*a* located in the upper face of the cover 8, further the case 10 is rotated from this state to the side of the cover 8 to thereby insert the tip portions of the resiliently engaging claws 11 into the holes 86*b* from the lower face of each of partition sections 86*c* located between the holes 86*a*, 86*b* to thus perform these positionings in a lateral direction, and then the engaging claws 12 are inserted into the cut-raised holes 87 to be engaged with the engaging lugs 87*a*, thus enabling the case 10 to be firmly assembled to the cover 8 without screws.

Figure 3:
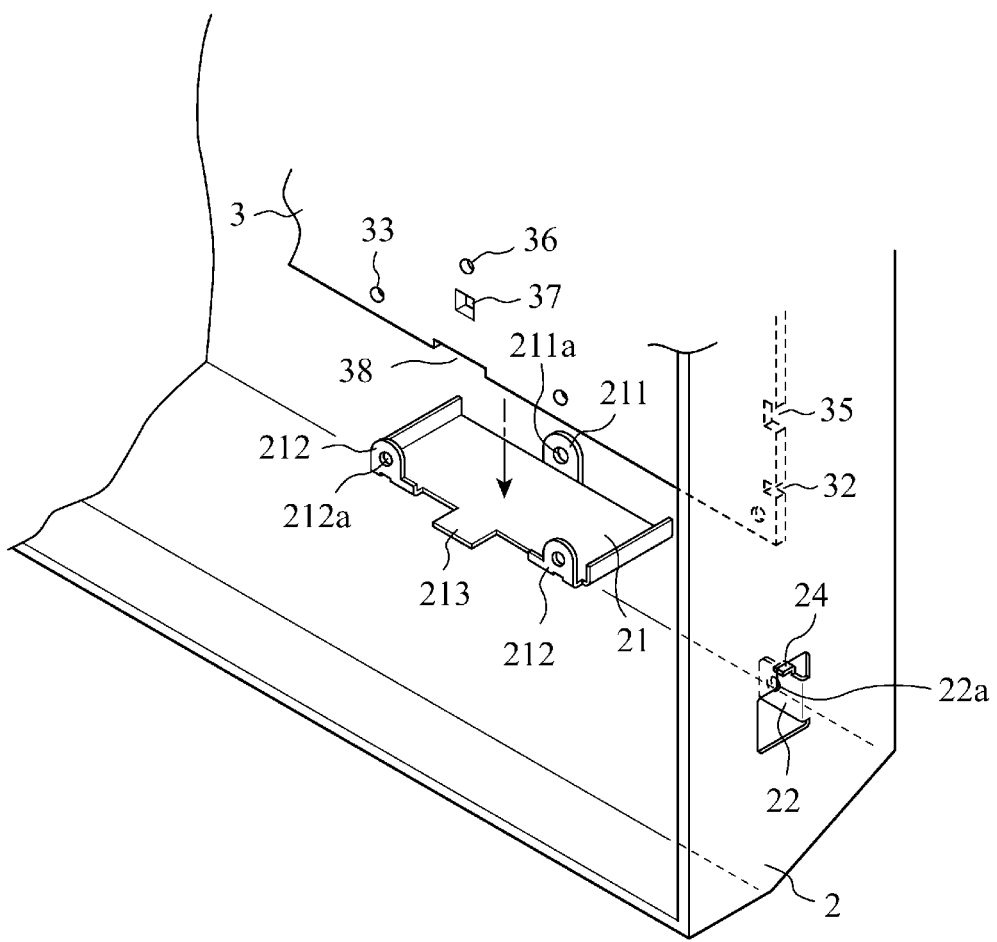
FIG. 3 is an exploded perspective view showing a relationship between a chassis and a screw-fixing section also serving as aboard receiver.
Figure 4:
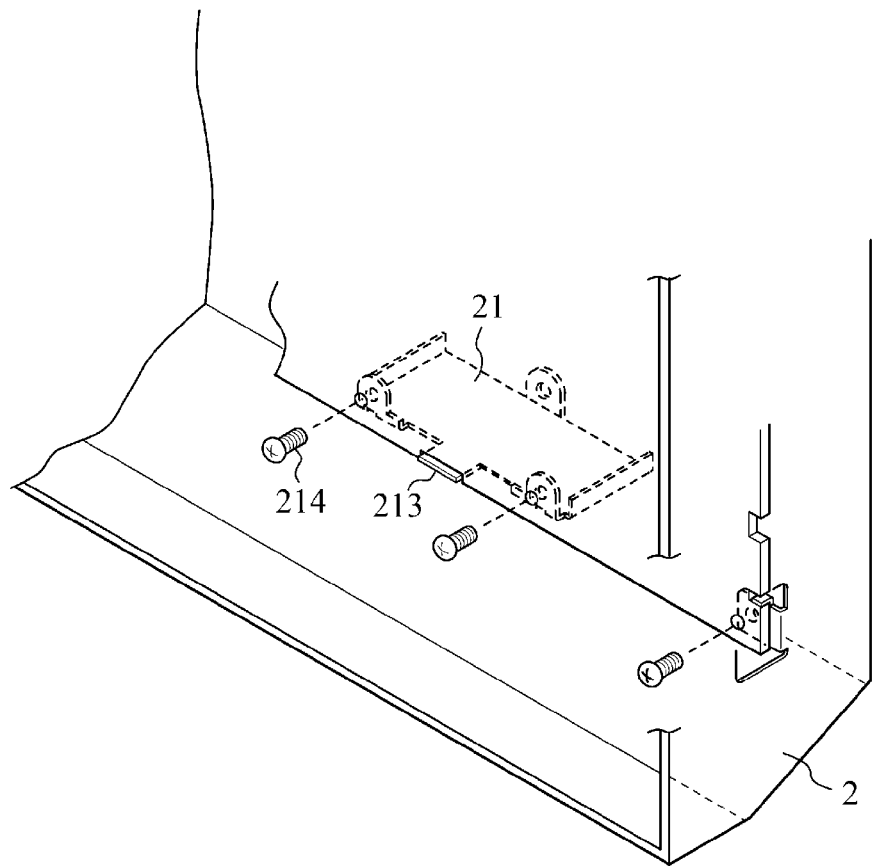
FIG. 4 is a perspective view showing a state where a board is disposed in a fixation position to the screw-fixing section also serving as the board receiver.
Figure 5:
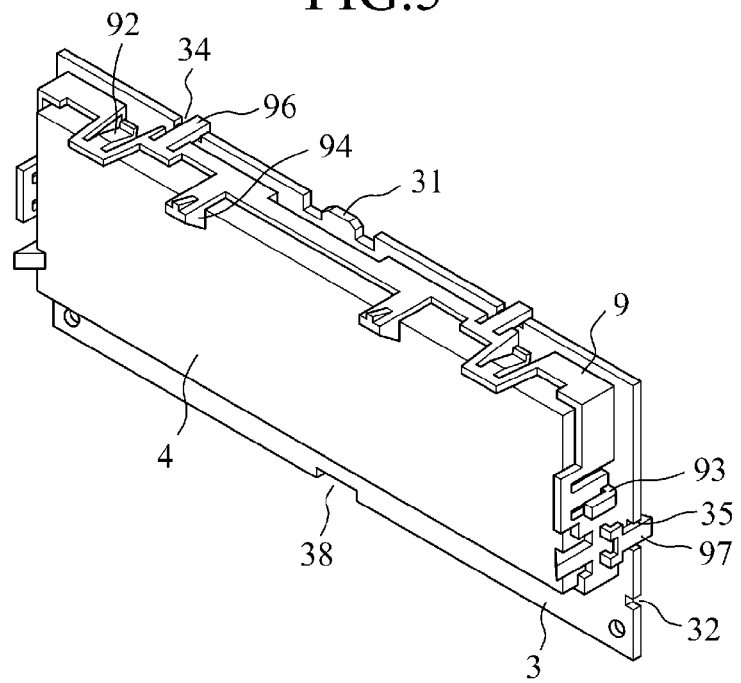
FIG. 5 is a perspective view of the board having a display assembled thereto through a holder.
Figure 6:
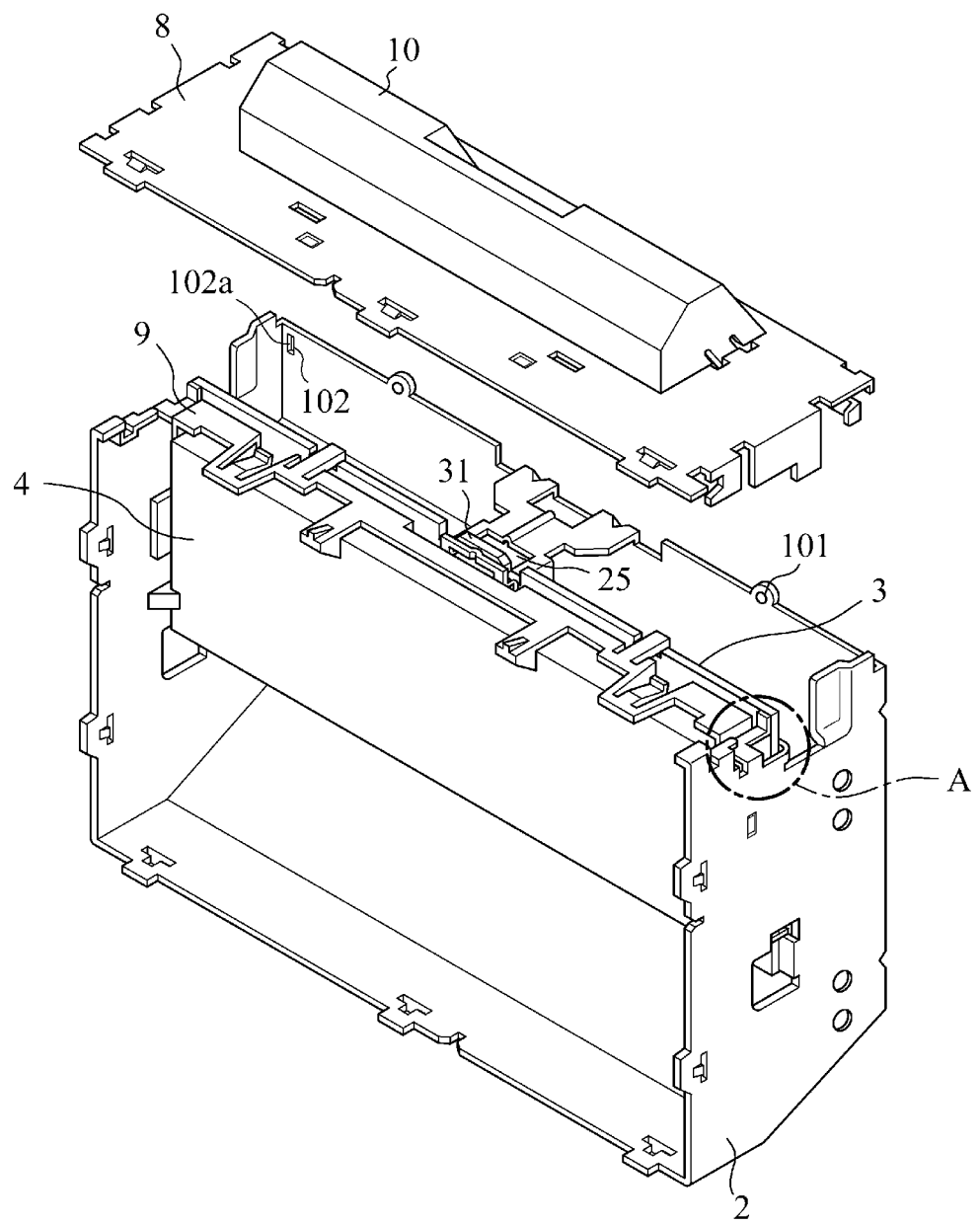
FIG. 6 is a perspective view showing a state where the board is assembled to the chassis.
Figure 7:
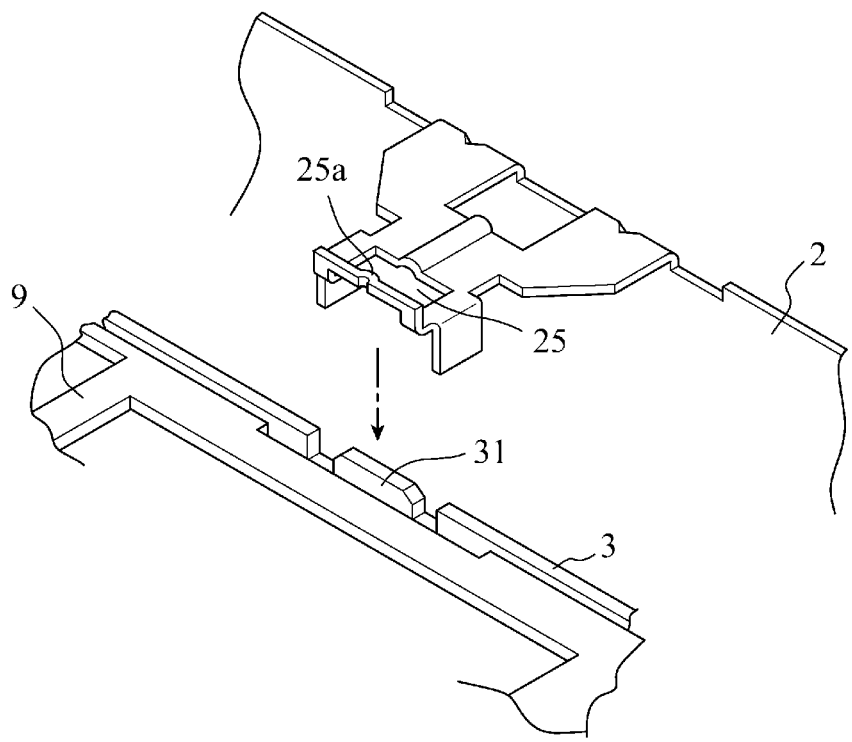
FIG. 7 is a perspective view before assembly showing a relationship between a protrusion of the board and a rectangular opening engaging section of the chassis.
Figure 8:
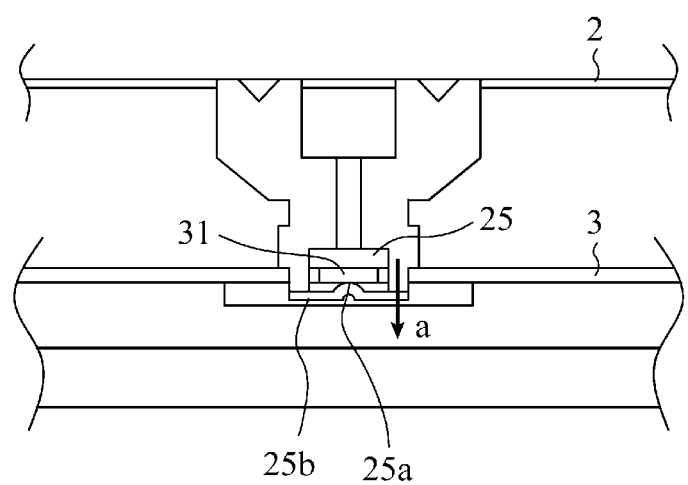
FIG. 8 is a perspective view of the protrusion of the board and the rectangular opening engaging section of the chassis after the assembly.
Figure 9:
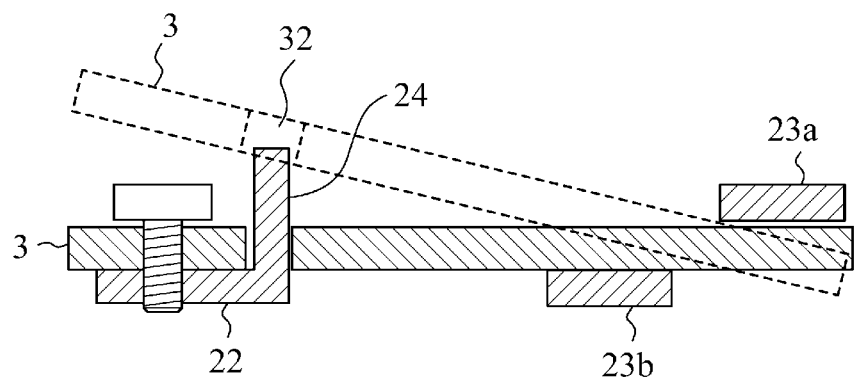
FIG. 9 is an explanatory view of a process for assembling the board to the chassis.
Figure 10:
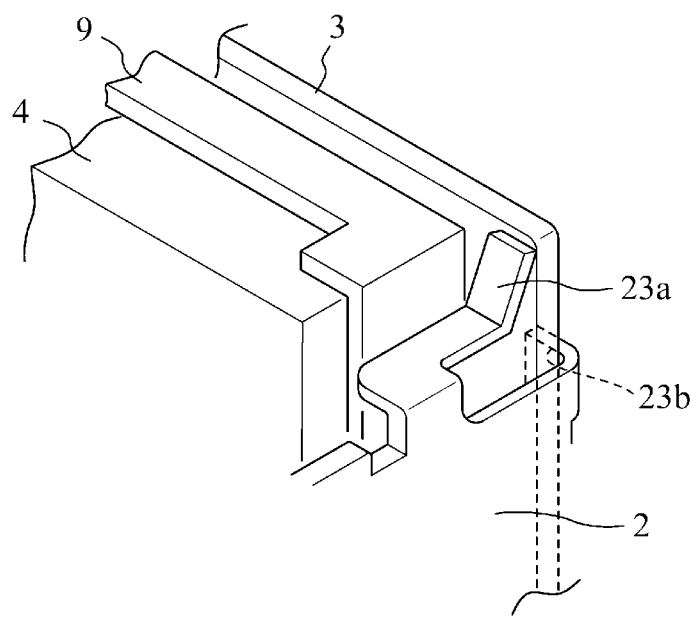
FIG. 10 is an enlarged perspective view of portion A of FIG. 6.

According to the present invention, in the electronic apparatus 1 thus arranged, it is contrived that the board 3 is assembled to the interior of the chassis 2 by reducing the number of screw fixations. FIG. 3 is an exploded perspective view showing a relationship between a chassis and a screw-fixing section also serving as a board receiver, FIG. 4 is a perspective view showing a state where a board is disposed in a fixation position to the screw-fixing section also serving as the board receiver, FIG. 5 is a perspective view of the board having a display assembled thereto through a holder, FIG. 6 is a perspective view showing a state where the board is assembled to the chassis, FIG. 7 is a perspective view before assembly showing a relationship between a protrusion of the board and a rectangular opening engaging section of the chassis, FIG. 8 is a perspective view of the protrusion of the board and the rectangular opening engaging section of the chassis after the assembly, FIG. 9 is an explanatory view of a process for assembling the board to the chassis, and FIG. 10 is an enlarged perspective view of portion A of FIG. 6.

As mentioned above, the chassis 2 in the board fixing structure according to the present invention includes: the screw fixing section (also serving as a board receiver) 21 provided in the interior thereof; the first board receiving section 22 each formed at the same height position as that of the screw fixing section (also serving as a board receiver) 21 by cutting and raising inwardly a portion of each side plate of the chassis 2 with sandwiching the screw fixing section (also serving as the board receiver) 21; the board gripping sections 23a, 23b (one of the sections is not shown) that are formed so as to grip the board 3 by cutting and raising inwardly another portion of each side plate of the chassis 2; the board assembling guide section 24 that is formed by folding a portion of the first board receiving section 22 at a substantially right angle toward the board mounting side; and the rectangular opening engaging section 25 formed by turning at a substantially right angle at the upper edge of the back side plate of the chassis 2 so as to engage with the protrusion 31 formed at the edge of the board that is not fixed by screws, and also the second board receiving section 26 that is formed by horizontally extending from each side of the rectangular opening engaging section toward the interior of the chassis and formed at the substantially same height position as those of the screw fixing section (also serving as a board receiver) 21 and the first board receiving section 22.

In the screw-fixing section (also serving as the board receiver) 21, as shown in FIG. 3, provided on one end side of the plate member thereof are a plurality of mounting lugs 211 formed and bent by mutually turning, and provided on the other end side thereof are a plurality of board receiving lugs 212 and a positioning protrusion 213 for engaging with a concavity of the board 3, with the mounting lugs 211 welded to the inner face of the chassis. Further, the mounting lug 211 is provided with a screw passing hole 211a for attaching the chassis 2 to an external component, and the board receiving lug 212 is provided with a screw hole 212a.

Formed in the board 3 are the protrusion 31 on the side of the assembling front end thereof; a cutout 32 at the rear end edge of each side thereof; screw passing holes 33 in the rear end portion; engaging concavities 34, 35 (see FIG. 5) with which the resiliently engaging claws 96, 97 of the holder 9 engage at the front end edge and each side edge thereof; through holes 36, 37 (see FIG. 3) with which a positioning pin and a resiliently engaging claw of the holder 9 through-engage, respectively, in the middle of the rear end; and a concavity 38 with which the positioning protrusion 213 of the screw-fixing section (also serving as the board receiver) 21 is engaged.

In the following, a process for assembling the board 3 to the chassis 2 will be described with the heavyweight display 4 assembled thereto through the holder 9: first, as shown in FIG. 7, the protrusion 31 on the side of the assembling front end of the board 3 that is not screw-fixed is coupled to the rectangular opening engaging section 25 of the chassis 2; then, as shown by dotted lines in FIG. 9, the board 3 is inclined and inserted into the chassis to be moved toward the assembling direction; thereafter as shown in FIG. 10, each side edge of the board 3 is gripped by the board gripping sections 23a, 23b, and in the movement termination position, the moving front end portion of the board 3 is mounted on the second board receiving section 26 to cause the protrusion 31 to enter the rectangular opening engaging section 25.

Under such a condition, the rear end side of the board 3 to be screw-fixed is rotated to mount the end side of the board to be screw-fixed on the screw-fixing section (also serving as the board receiver) 21 and the first board receiving section 22 as shown in full lines in FIG. 9; thus, the board assembling guide section 24, which is formed and turned at a portion of the first board receiving section 22, is engaged with the cutout 32 located at the side end edge of the board as shown in FIG. 4 to support the board 3 in a predetermined position. Further, screws 214 passed through the screw passing holes 33 at the rear end of the board mounted on the screw-fixing section (also serving as the board receiver) 21 are screwed into the screw hole 212a formed in the screw-fixing section (also serving as the board receiver) and the screw hole 22a formed in the first board receiving section 22, respectively, to be screw-fixed thereto.

In such a way, as the rear end of the board is screw-fixed thereto, the front end edge of the board that is not screw-fixed is slightly lifted up in the direction of the arrow "a" as shown in FIG. 8, and the face of the board is pressed by a protrusion 25a that is formed on the inner face of the upper side of the rectangular opening engaging section 25 to be firmly fixed. In this case, since the protrusion 25a has to have resiliency, an upper side 25b of the rectangular opening engaging section 25 is formed as narrow and long as possible.

As discussed above, according to the present invention, it is arranged as follows: the protrusion formed at the end edge of the board that is not screw-fixed is inserted into the rectangular opening engaging section formed on the chassis; the sides of the board are mounted on the screw-fixing section (also serving as the board receiver), and the first and the second board receiving sections formed on the chassis in a cutting and raising manner, respectively; each side portion of the board is gripped by the board gripping sections; and one side of the board is screw-fixed to the screw-fixing section (also serving as the board receiver). Thus, even if the board includes a heavyweight display and so on, the board is gripped by the gripping sections on the side of the chassis, thereby assembling positively the board to the chassis even in reduced screw fixations, thereby reducing the number of screw fixations.

Further, since the board is assembled to the chassis while inserting the board assembling guide section formed at a portion of the first board receiving section into the cutout of the board, positioning for assembly is facilitated, and the ability of the board to be assembled thereto is enhanced. Moreover, the rectangular opening engaging section and the board gripping sections can eliminate the necessity of space used for screw fixations on the front end side and each side of the board to be gripped and held, space savings in the board and electronic apparatus can be achieved; furthermore, tension is normally applied on the board due to the resiliency of the rectangular opening engaging section and the board gripping sections. Thus, there is obtained an advantageous effect that even if the board is subjected to vibration, the assembling state thereof does not come loose.

Industrial Applicability

According to the board fixing structure of the present invention, it can be contrived to reduce the number of screw fixations and achieve space savings in a board, an electric apparatus and so on. Thus, it is suitable for use in an electric apparatus and so on having a structure for fixing a board to a chassis.

The invention claimed is:

1. A board fixing structure comprising: a box-shaped and hollow chassis, and a board
   wherein the chassis includes:
   a first board receiving section that is formed inwardly from a portion of each of two side plates of the chassis;
   a board gripping section that is formed inwardly from another portion of each of the two side plates thereof;
   a rectangular opening engaging section that extends at a substantially right angle from an edge of the upper end of a back side plate of the chassis; and
   a second board receiving section that is formed from both sides of the rectangular opening engaging section toward the interior of the chassis, and
   wherein the board includes:
   a protrusion formed at an edge thereof to engage with the rectangular opening engaging section.

2. The board fixing structure according to claim 1, wherein the rectangular opening engaging section has a protrusion for abutting against a face of the board on an inner face of the upper side thereof.

3. The board fixing structure according to claim 1, wherein the first board receiving section has a board assembling guide section that is formed by turning a portion of the first board receiving section, and the board is provided with a cutout with which the board assembling guide section engages.

4. A board fixing structure comprising a box-shaped and hollow chassis, and a board,
   wherein the chassis includes:
   a first board receiving section is formed by cutting and raising inwardly a portion of each of two side plates of the chassis, the two side plates opposing each other across a screw fixing-section also serving as a board receiver that is provided in the interior of the chassis;
   a board gripping section that is formed by cutting and raising inwardly another portion of each of the two side plates thereof;
   a rectangular opening engaging section that extends at a substantially right angle from an edge of the upper end of a back side plate of the chassis; and
   a second board receiving section at is formed by horizontally extending from both sides of the rectangular opening engaging section toward the interior of the chassis, and formed at the substantially same height position as those of the screw-fixing section also serving as the board receiver and the first board receiving section, and
   wherein the board includes:
   a protrusion formed at an edge thereof that is not screw-fixed to engage with the rectangular opening engaging section; and
   a screw passing hole for threadedly engaging with the screw-fixing section also serving as the board receiver.

5. The board fixing structure according to claim 4, wherein the rectangular opening engaging section has a protrusion for abutting against a face of the board on an inner face of the upper side thereof.

6. The board fixing structure according to claim 4, wherein the first board receiving section has a board assembling guide section that is formed by turning a portion of the first board receiving section, and the board is provided with a cutout with which the board assembling guide section engages.

* * * * *